(12) United States Patent
Gorbachov et al.

(10) Patent No.: US 9,985,592 B2
(45) Date of Patent: May 29, 2018

(54) HIGH GAIN RF POWER AMPLIFIER WITH NEGATIVE CAPACITOR

(71) Applicant: SKYWORKS SOLUTIONS, INC., Woburn, MA (US)

(72) Inventors: Oleksandr Gorbachov, Irvine, CA (US); Lisette L. Zhang, Irvine, CA (US); Lothar Musiol, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days. days.

(21) Appl. No.: 15/153,605

(22) Filed: May 12, 2016

(65) Prior Publication Data

US 2016/0336907 A1  Nov. 17, 2016

Related U.S. Application Data (60) Provisional application No. 62/160,936, filed on May 13, 2015.

(51) Int. Cl.

| | |
|---|---|
| *H03G 3/12* | (2006.01) |
| *H03F 3/21* | (2006.01) |
| *H03F 1/56* | (2006.01) |
| *H03F 3/193* | (2006.01) |

(Continued)

(52) U.S. Cl.
CPC .............. *H03F 3/21* (2013.01); *H03F 1/342* (2013.01); *H03F 1/565* (2013.01); *H03F 3/193* (2013.01);

(Continued)

(58) Field of Classification Search
CPC ... H03F 1/34; H03F 1/565; H03F 3/19; H03F 3/193; H03F 3/21; H03F 3/45071; H03F 2200/144; H03F 2203/45222; H03F 2200/451; H03F 2200/391; H03F 2200/369; H03F 2200/225; H03F 2200/171

(Continued)

(56) References Cited

U.S. PATENT DOCUMENTS

| | | | | |
|---|---|---|---|---|
| 3,023,369 A | * | 2/1962 | Horowitz | ............. H03G 1/0052 330/283 |
| 4,583,050 A | * | 4/1986 | Shinomiya | ........... H03G 1/0052 330/283 |

(Continued)

FOREIGN PATENT DOCUMENTS

| | | |
|---|---|---|
| WO | 2012054343 | 4/2012 |
| WO | 2014110435 | 7/2014 |

OTHER PUBLICATIONS

Search Report and Written Opinion for International Application Serial No. PCT/US2016/032531; dated Aug. 17, 2016.

*Primary Examiner* — Khanh V Nguyen
(74) *Attorney, Agent, or Firm* — Stetina Brunda Garred & Brucker (57) ABSTRACT

A radio frequency (RF) power amplifier circuit includes an input and an output. A power amplifier transistor has a first terminal connected to the input, a second terminal connected to the output, and a third terminal defined by a degeneration inductance. A first capacitor is connected to the third terminal of the power amplifier transistor, along with a negative capacitance circuit connected in series with the first capacitor. The negative capacitance and the first capacitor define a series resonance at a predefined operating frequency band, which shunts the degeneration inductance of the third terminal.

20 Claims, 9 Drawing Sheets

(51) Int. Cl.
*H03F 3/195* (2006.01)
*H03F 3/45* (2006.01)
*H03H 11/48* (2006.01)
*H03F 3/191* (2006.01)
*H03F 1/34* (2006.01)

(52) U.S. Cl.
CPC ......... *H03F 3/195* (2013.01); *H03F 3/45475* (2013.01); *H03H 11/481* (2013.01); *H03F 1/34* (2013.01); *H03F 3/191* (2013.01); *H03F 2200/144* (2013.01); *H03F 2200/15* (2013.01); *H03F 2200/171* (2013.01); *H03F 2200/225* (2013.01); *H03F 2200/294* (2013.01); *H03F 2200/369* (2013.01); *H03F 2200/372* (2013.01); *H03F 2200/391* (2013.01); *H03F 2200/451* (2013.01); *H03F 2203/45222* (2013.01); *H03F 2203/45526* (2013.01)

(58) Field of Classification Search
USPC .................................................. 330/283, 302
See application file for complete search history.

(56) References Cited

U.S. PATENT DOCUMENTS

| | | | | |
|---|---|---|---|---|
| 5,307,026 A * | 4/1994 | Mucke | .................. | H03G 7/001 330/283 |
| 5,929,707 A * | 7/1999 | Samuels | ................ | H03F 1/3241 330/283 |
| 6,166,599 A * | 12/2000 | Aparin | .................. | H03F 1/3241 330/302 |
| 6,681,103 B1 * | 1/2004 | Rogers | ............... | H03H 11/1213 455/285 |
| 6,696,902 B2 | 2/2004 | Lerke et al. | | |
| 7,030,714 B2 | 4/2006 | Korol | | |
| 9,093,967 B2 | 7/2015 | Gorbachov | | |
| 2010/0301940 A1 | 12/2010 | Mole et al. | | |
| 2010/0327940 A1 | 12/2010 | Eisenstadt et al. | | |
| 2011/0165849 A1 | 7/2011 | Gorbachov | | |
| 2012/0256709 A1 | 10/2012 | Hitko et al. | | |
| 2012/0319782 A1 | 12/2012 | Nam et al. | | |

* cited by examiner

HIGH GAIN RF POWER AMPLIFIER WITH NEGATIVE CAPACITOR

CROSS-REFERENCE TO RELATED APPLICATIONS

The application relates to and claims the benefit under 35 U.S.C. § 119(e) to U.S. Provisional Patent Application No. 62/160,936 filed May 13, 2015 and entitled "HIGH GAIN RF POWER AMPLIFIER WITH NEGATIVE CAPACITOR," the entire contents of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) integrated circuits, and more particularly, to high gain RF power amplifiers with a negative capacitor.

2. Related Art

Generally, wireless communications involve an RF carrier signal that is variously modulated to represent data, and the modulation, transmission, receipt, and demodulation of the signal conform to a set of standards for coordination of the same. Many different mobile communication technologies or air interfaces exist, including GSM (Global System for Mobile Communications), EDGE (Enhanced Data rates for GSM Evolution), and UMTS (Universal Mobile Telecommunications System) W-CDMA (Wideband Code Division Multiple Access). More recently, 4G (fourth generation) technologies such as LTE (Long Term Evolution), which is based on the earlier GSM and UMTS standards, are being deployed. Besides these mobile communications modalities, local area data networking modalities such as Wireless LAN (WLAN)/WiFi, WiMax, and so forth.

A fundamental component of any wireless communications system is the transceiver, that is, the combined transmitter and receiver circuitry. The transceiver encodes the data to a baseband signal and modulates it with an RF carrier signal. Upon receipt, the transceiver down-converts the RF signal, demodulates the baseband signal, and decodes the data represented by the baseband signal. An antenna connected to the transmitter converts the electrical signals to electromagnetic waves, and an antenna connected to the receiver converts the electromagnetic waves back to electrical signals.

The output of the transmitter is connected to a power amplifier, which amplifies the RF signals prior to transmission via the antenna. The receiver is connected to the output of a low noise amplifier, the input of which is connected to the antenna and receives inbound RF signals. A transmit/receive switch selectively interconnects the antenna to the output of the power amplifier during transmission, and to the input of the low noise amplifier during reception. Thus, the power amplifier, the low noise amplifier, and the antenna switch serves as key building blocks in RF transceiver circuitry. These components may be referred to as a front end circuit.

In most wireless communications such as the aforementioned WCDMA and 3G/4G cellular, it is important for the RF power amplifier to have high efficiency. Typically, a power amplifier is comprised of several stages, each of which contributes to define an overall gain from the transceiver to the antenna. There are various factors that limit the gain of the RF power amplifier, including those that relate to implementation as integrated circuits. One limitation is the source or emitter degeneration inductance resulting from connecting the source terminal or the emitter terminal of the power amplifier transistor to package ground. This connection is made via bond wires, flip-chip balls, or through-silicon vias (TSV) in various implementations.

The inductance associated with this circuit segment is understood to substantially reduce gain. Even a modest 0.35 nH inductance, which is typical of a short bond wire, can result in almost 8 dB reduction in gain. Multiple parallel bond wires may be utilized to counteract this and increase gain, but may not be practical because of limited die area and sensitivity. The alternative of TSVs have a higher cost and susceptible to degradation attributable to mechanical stress. Although flip-chip wafers are well suited for modular applications, the compatibility of devices based thereon with conventional chip-on-board (COB) applications remain problematic.

Prior solutions have contemplated the addition of a resonance circuit (inductor and capacitor) connected to the source or emitter and tuned for series resonance at the operating frequency. This is understood to reduce the influence of the degeneration inductance and thereby increase the power amplifier gain. However, this configuration is understood to lead to stability issues at the power amplifier stage.

Accordingly, there is a need in the art for low cost circuit solutions with increased gain in RF transistor stages. There is a need for high gain RF power amplifiers with a negative capacitor.

BRIEF SUMMARY

The present disclosure is directed to an RF power amplifier with significantly increased gain with each RF power transistor stage based upon negative capacitance circuitry. The RF power amplifier stages may be placed at any position inside the die and far from the edges, thereby eliminating the use of through-silicon vias (TSVs) in many cases. These solutions may be implemented with any type of semiconductor technology, including CMOS (complementary metal oxide semiconductor), GaAs HBT (Gallium Arsenide, heterojunction bipolar, and so forth. Furthermore, these circuits are contemplated for RF power amplifiers, as well as any other RF integrated circuit requiring a sensitive connection to package ground.

One embodiment of the present disclosure is an RF power amplifier circuit for a predefined operating frequency band. The RF power amplifier circuit has an input and an output. There may be a power amplifier transistor with a first terminal that is connected to the input, a second terminal connected to the output, and a third terminal defined by a degeneration inductance. The RF power amplifier circuit may also include a first capacitor connected to the third terminal of the power amplifier transistor. Furthermore, there may be a negative capacitance circuit that is connected to the third terminal in series with the first capacitor. The negative capacitance and the first capacitor may define a series resonance at the predefined operating frequency band. The inductance of the third terminal may be shunted by the negative capacitance circuit and the first capacitor.

The various embodiments of the present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the several presently contemplated embodiments of power amplifier circuits with a negative capacitor, and is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
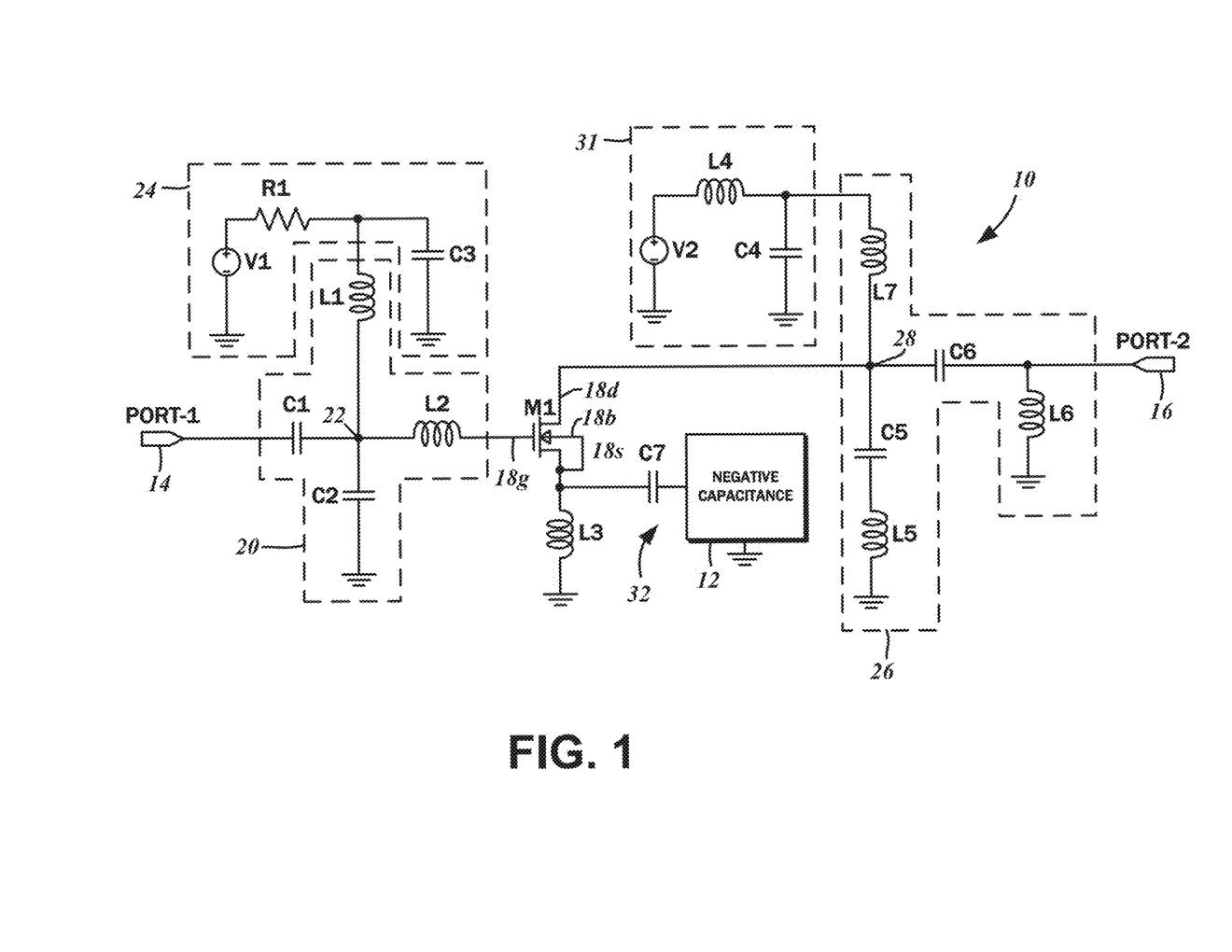
FIG. 1 is a schematic diagram of an RF power amplifier circuit with a negative capacitance circuit in accordance with the present disclosure.

FIG. 1 shows an embodiment of an RF power amplifier circuit 10 with a negative capacitance circuit 12. Generally, the RF power amplifier circuit 10 is defined by an input port 14 on which an RF signal is received, an output port 16 from which the amplified RF signal is output, and a single stage amplifier transistor M1. It will be appreciated by those having ordinary skill in the art that the single stage configuration utilizing the one n-channel metal oxide semiconductor (NMOS) transistor is by way of example only and not of limitation, and any other suitable alternative configuration of the power amplifier circuit may be substituted without departing from the present disclosure. Along these lines, the transistor M1 need not be the depicted NMOS type, and the various embodiments of the present disclosure may be substituted with bipolar junction transistors, or any other type of transistor and fabrication technologies. The transistor M1, as an NMOS type, has a gate terminal 18g, a drain terminal 18d, a source terminal 18s, and a body terminal 18b. When utilizing other types of transistors, the terminals thereof, e.g., base, collector, emitter, are understood to correspond to the gate, drain, and source terminal, respectively. Accordingly, reference to one type one transistor terminal herein is understood to also refer to the corresponding terminal on a different type of transistor.

In further detail, the RF power amplifier circuit 10 includes an input matching circuit 20 connected to the input port 14 and to the gate terminal 18g of the transistor M1. The input matching circuit 20 is generally comprised of a capacitor C1, capacitor C2, an inductor L1, and an inductor L2, each of which are connected to each other at a node 22. These components are tuned to impedance match the transistor M1 to an RF signal source connected to the input port 14. The capacitor C1 is also connected to the input port 14, the capacitor C2 is connected to ground, and the inductor L2 is connected to the gate terminal 18g. There is a control voltage circuit 24 comprised of a control voltage V1, a resistor R1, and an RF decoupling capacitor C3. The control voltage V1 is applied to the gate terminal 18g of the transistor M1 through the resistor R1 to establish a particular bias point. Although a simple bias control circuit implementation is shown, it will be recognized that any suitable implementation may be utilized. The inductor L1 is thus connected to the control voltage circuit 24, and specifically the control voltage V1 through the resistor R1. The aforementioned RF decoupling capacitor C3 therefore isolates the bias/control voltage V1 from the RF signal path.

The source terminal 18s of the transistor M1 is connected to an inductor L3, which in turn is connected to ground. Thus, the transistor M1 is in a negative feedback configuration. The body terminal 18b is tied to the source terminal 18s. The inductor L3 represents the source inductance of the transistor M1, and may be a bond wire.

The transistor M1 is also connected to an output matching circuit 26 comprised of a capacitor C5, a capacitor C6, an inductor L5, and inductor L6, and an inductor L7. The output matching circuit 26, in turn, is connected to the output port 16, and impedance matches the transistor M1 to the component connected to the output port 16, which may be an antenna. The drain terminal 18d of the transistor M1 is connected to a node 28, to which the capacitor C5, the capacitor C6, and the inductor L7 are connected. The inductor L5 is connected in series with the capacitor C5, and to ground. Specifically, the inductance value of the inductor L5 and the capacitance value of the capacitor C5 are selected to define a series resonant circuit at the second harmonic of the operating frequency of the input RF signal. The capacitor C6 is connected to the inductor L6 and to the output port 16.

The drain terminal 18d of the transistor M1 is also connected to a bias circuit 31 comprised of a bias voltage V2, and a low pass filtering circuit defined by the inductor L4 and the capacitor C4. Additionally, the capacitor C4 serves RF decoupling functions to isolate the RF signal at the drain terminal 18d of the transistor M1 from the bias voltage V2.

With the foregoing configuration of the RF power amplifier circuit 10, an RF signal applied to the input port 14 is amplified by the transistor M1 and output from the output port 16. As indicated above, the source degeneration inductance L3 limits the gain of the power amplifier, and so the present disclosure contemplates the inclusion of the negative capacitance circuit 12. In further detail, additionally connected to the source terminal 18s of the transistor M1 is a capacitor C7, and connected in series thereto is the negative capacitance circuit 12, which is connected to ground. The negative capacitance circuit 12 and the capacitor C7 are configured for series resonance within the operating frequency band, with very low equivalent impedance. According to some embodiments, this equivalent impedance may be less than 0.5 Ohm.

The series resonance circuit comprised of the negative capacitance circuit 12 and the capacitor C7 are understood to effectively shunt the source degeneration inductance L3. Thus, the resulting gain of a power amplifier stage based on the transistor M1 can be increased, as will be explained below. Furthermore, it is envisioned that this power amplifier stage has no stability issues. While a specific implementation of the negative capacitance circuit 12 will be described herein, those having ordinary skill in the art will recognize that any other configuration of the negative capacitance circuit may be readily substituted without departing from the scope of the present disclosure.

Figure 2A:
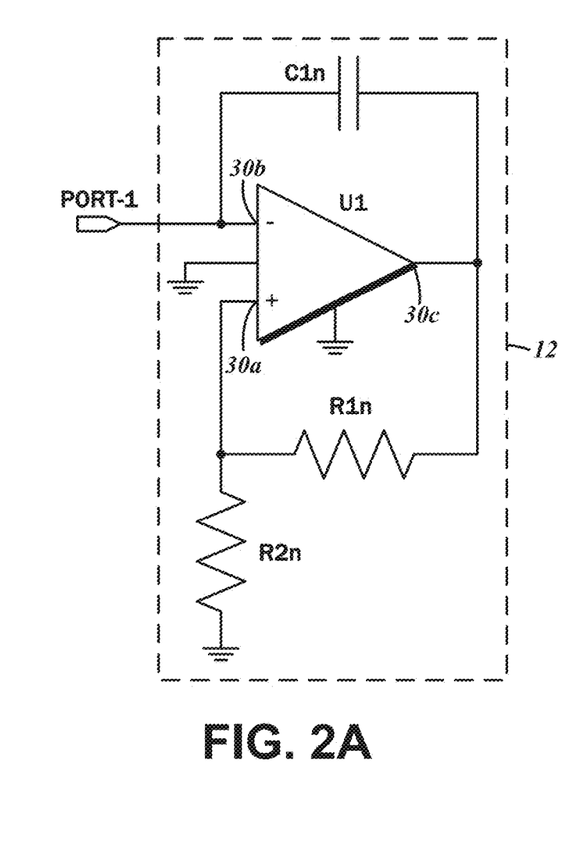
FIG. 2A is a schematic diagram of an exemplary embodiment of the negative capacitance circuit implemented with an operational amplifier.
Figure 2B:
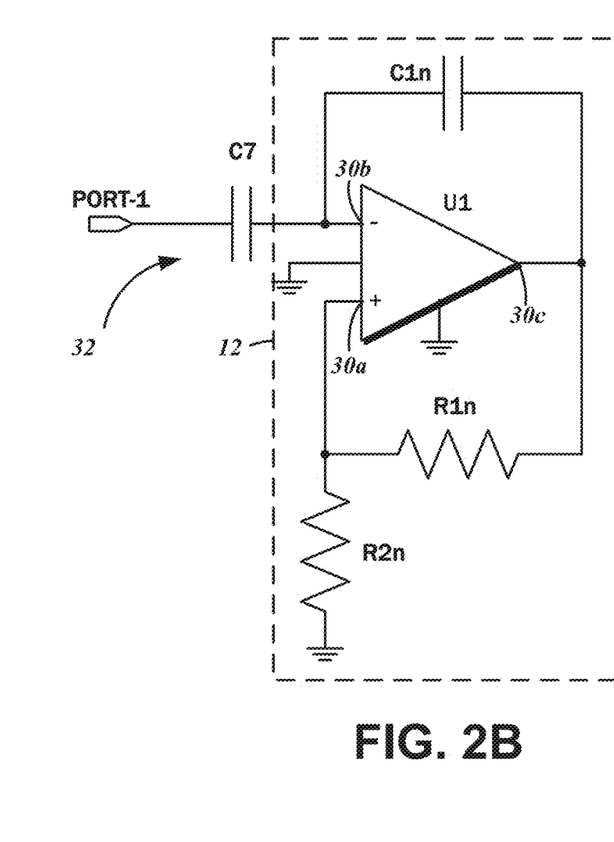
FIG. 2B is a schematic diagram of a series resonance circuit defined by the negative capacitance circuit and first capacitor.

Referring now to the schematic diagram of FIG. 2A, one embodiment of the negative capacitance circuit 12 is based on an operational amplifier U1 defined by a positive or non-inverting input 30a, a negative or inverting input 30b, and an output 30c. A negative capacitance circuit first capacitor C1n is connected across the inverting input 30b and the output 30c. Additionally, a negative capacitance circuit first resistor R1n is connected across the non-inverting input 30a and the output 30c. Also connected to the non-inverting input 30a is a negative capacitance circuit second resistor R2n, which is connected to ground. FIG. 2B illustrates a series resonant circuit 32 that is comprised of the negative capacitance circuit 12 with the capacitor C7.

Figure 3A:
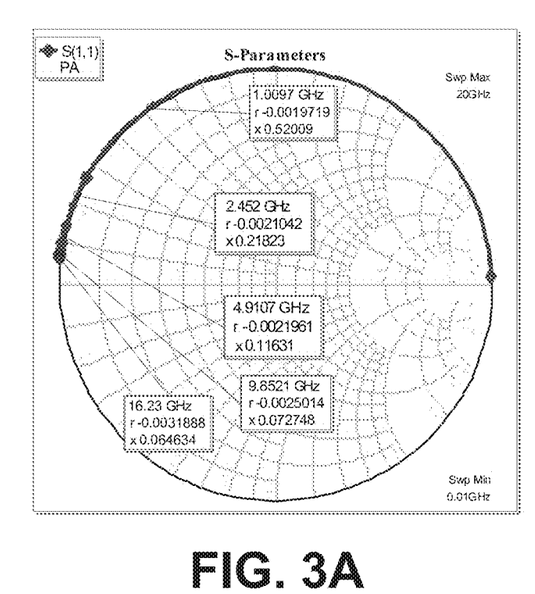
FIG. 3A is a Smith chart showing the scattering parameters (S-parameters) of the negative capacitance circuit shown in FIG. 2A.
Figure 3B:
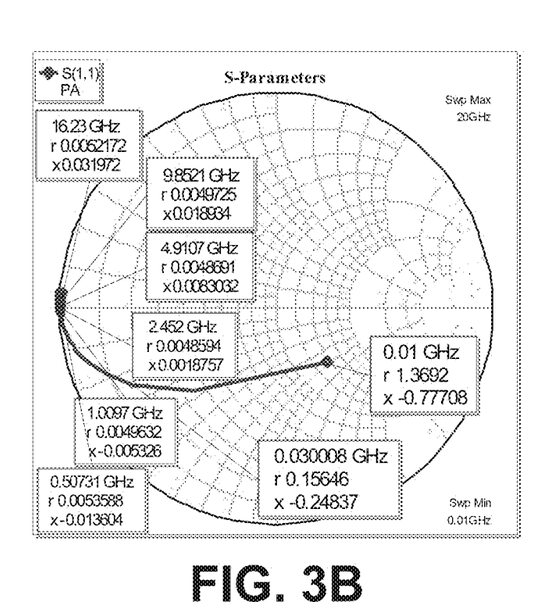
FIG. 3B is a Smith chart showing the S-parameters for the series resonance circuit including the negative capacitance circuit and a first capacitor.
Figure 3C:
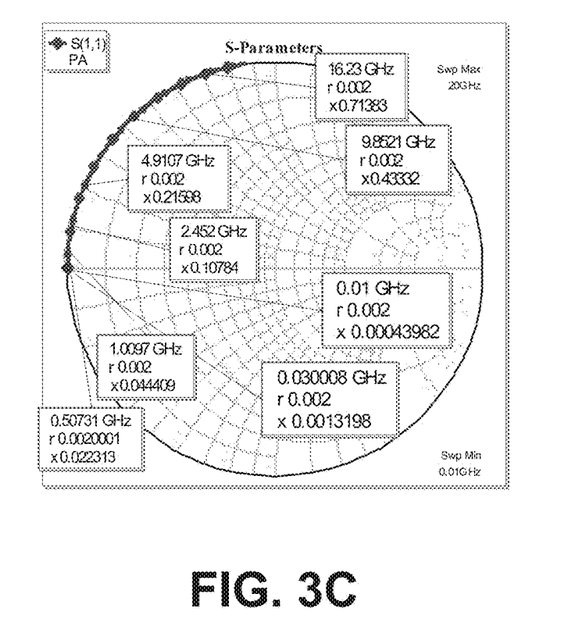
FIG. 3C is a Smith chart showing the S-parameters of a segment of the power amplifier circuit including a source degeneration inductance.
Figure 3D:
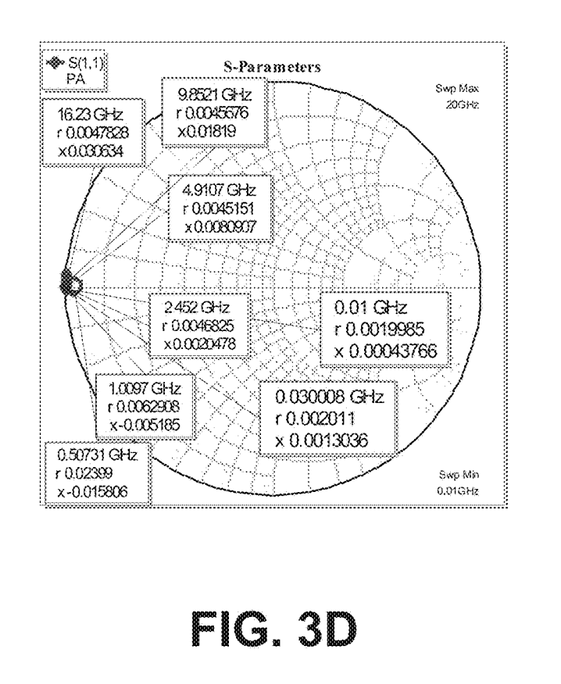
FIG. 3D is a Smith chart showing the S-parameters of the series resonance circuit in parallel with the source degeneration inductance.

The Smith charts of FIGS. 3A-3D illustrate the scattering parameters (S-Parameters) of these circuits based upon simulated responses with certain predefined circuit parameters. In the simulation, the operational amplifier U1 has a DC voltage gain of 1000, and an output impedance of 100 Ohm. The 3 dB frequency bandwidth is 2 GHz. The input impedance at non-inverting and inverting inputs 30a, 30b is set to 100 kOhm, the negative capacitance circuit first capacitor C1n is set to 6 pF, the negative capacitance circuit first resistor R1n and the negative capacitance circuit second resistor R2n are both set to 1 kOhm, and the capacitance C7 is set to 6 pF. In further detail, the Smith Chart of FIG. 3A plots S11 of the negative capacitance circuit 12, while the Smith chart of FIG. 3B plots S11 of the series resonant circuit 30, that is, the negative capacitance circuit 12 together with the capacitor C7. The Smith chart of FIG. 3C plots S11 of the inductance L3, which is 0.35 nH. The Smith chart of FIG. 3D plots S11 of the series resonant circuit 32 in parallel with the inductance L3. The series resonant circuit 32 based on the negative capacitance circuit 12 is understood to have a narrow spread of impedances over a wide frequency range. As shown in the Smith charts, the impedances also do not spread into the capacitive components.

Figure 4:
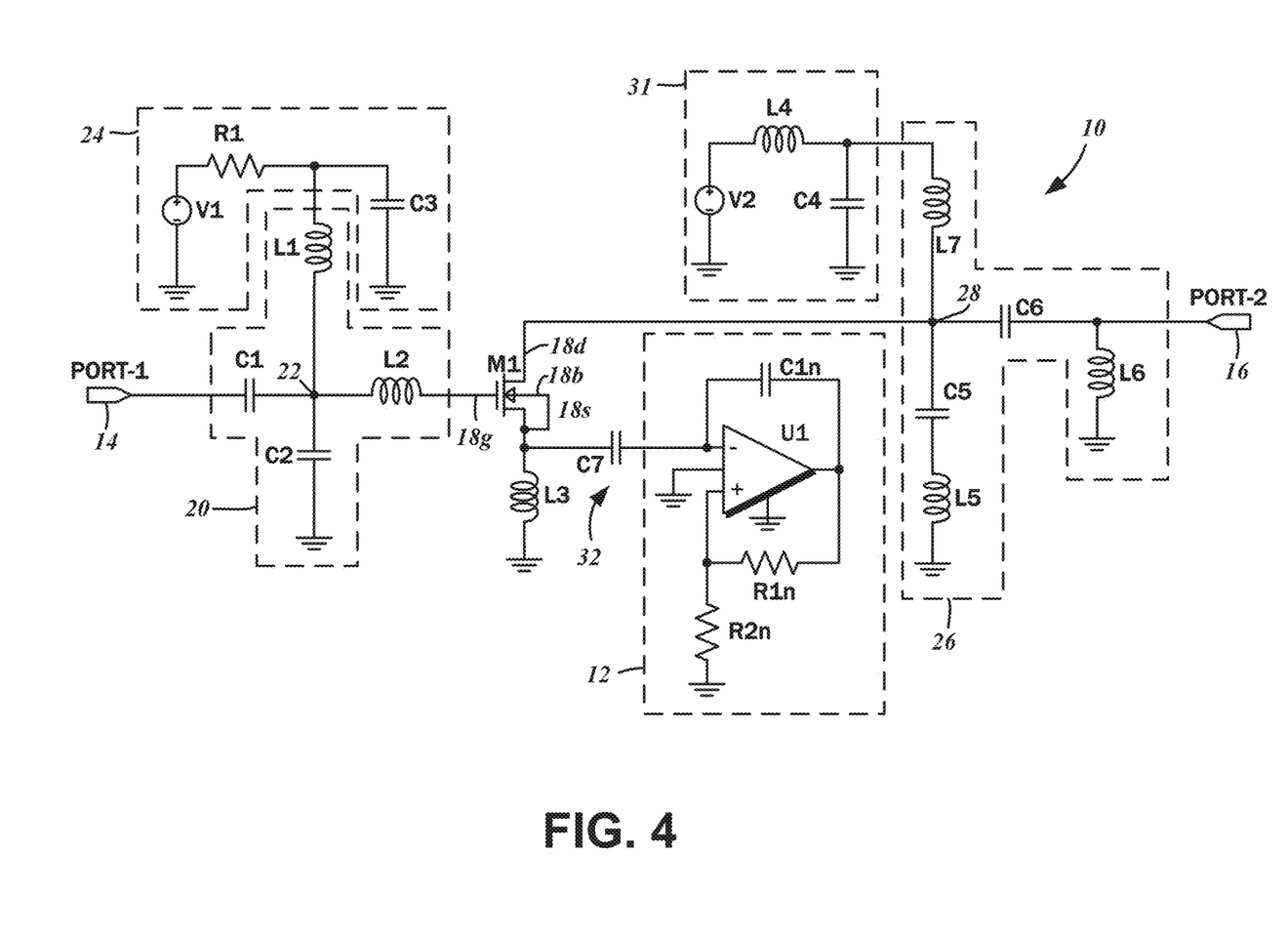
FIG. 4 is a schematic diagram of the RF power amplifier circuit incorporating the operational amplifier-based negative capacitance circuit.

FIG. 4 shows additional details of an embodiment of the RF power amplifier circuit 10 with the operational amplifier-based negative capacitance circuit 12 described above. Again, the negative capacitance circuit 12 together with the capacitor C7 defines a series resonant circuit with low equivalent impedance of under 0.5 Ohm at the operating frequency band. The series resonant circuit 32, and specifically the capacitor C7 is connected to the source terminal 18s of the power amplifier transistor M1, as is the source degeneration inductance L3. It is understood that the series resonant circuit 32 effectively shunts the inductance L3, with a resulting increase in gain of the power amplifier stage based upon the transistor M1, while maintaining stability.

Figure 5A:
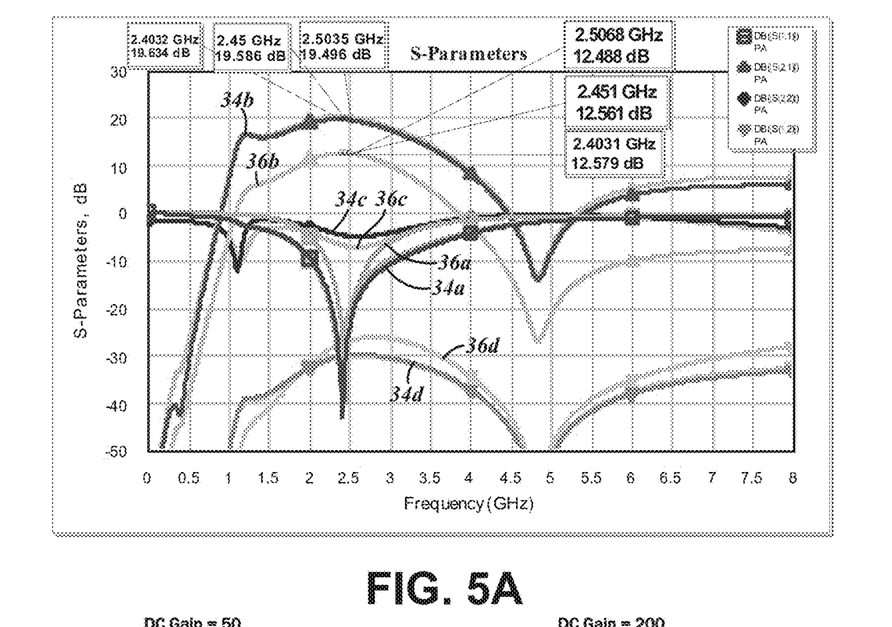
FIG. 5A is graph plotting the S-parameters of the RF power amplifier with the negative capacitance circuit as depicted in FIG. 4.

The graph of FIG. 5A plots simulated small-signal S-parameters versus frequency of the RF power amplifier circuit 10 shown in FIG. 4, with particular focus on the 2.4 GHz ISM (industrial-scientific-medical) band. A first plot 34a shows an input port return loss (S11), while a second plot 34b shows the amplifier gain (S21). Furthermore, a third plot 34c shows the output port return loss (S22), and a fourth plot 34d shows the reverse isolation (S12). The plots 34a-d correspond to the simulated S-parameters for the RF power amplifier circuit 10 with the negative capacitance circuit 12 as presently contemplated. The graph of FIG. 5A also includes a first plot 36a of the input port return loss (S11), a second plot 36b of the amplifier gain (S21), a third plot 36c of the output port return loss (S22), and the fourth plot 36d of the reverse isolation (S12) that correspond to the simulated S-parameters for an RF power amplifier circuit with a direct source to ground connection in comparison. As can be seen, the gain of the power amplifier stage in the RF power amplifier circuit 10 utilizing the negative capacitance circuit 12 can reach levels similar to an RF power amplifier circuit with a direct source to ground connection over a wide frequency range.

Figure 5B:
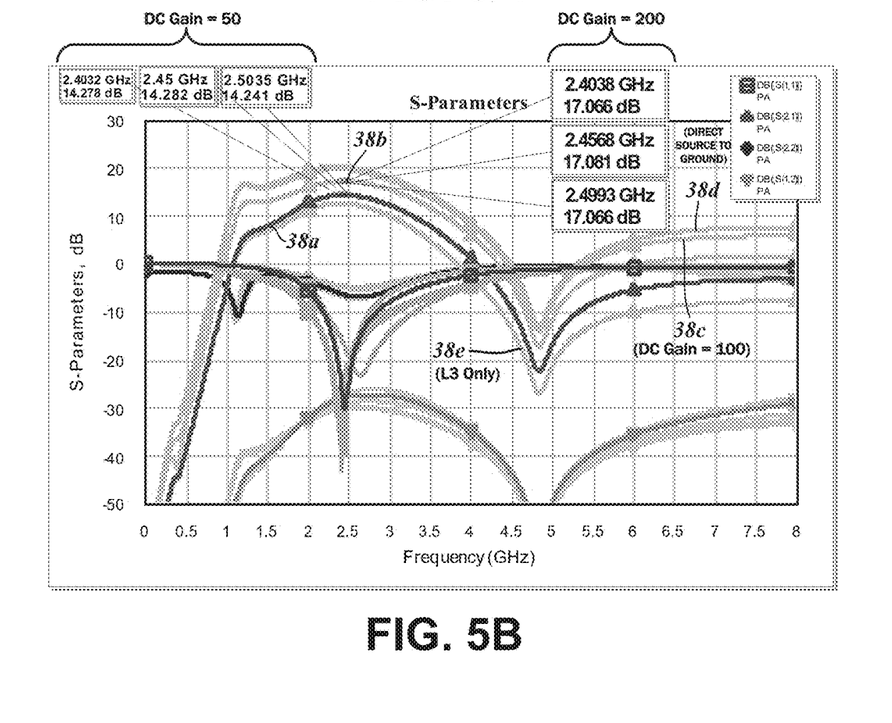
FIG. 5B is a graph plotting the S-parameters of the RF power amplifier of the present disclosure over the operational amplifier direct current (DC) voltage gain.

The graph of FIG. 5B likewise plots the various simulated small-signal S-parameters versus frequency of the RF power amplifier circuit 10, though with additional plots corresponding to different direct current (DC) voltage gain levels of the operational amplifier U1. In particular, a first plot 38a shows the gain of the RF power amplifier circuit 10 including the negative capacitance circuit 12 with the DC voltage gain of the operational amplifier U1 set to 50. A second plot 38b shows the gain of the RF power amplifier circuit 10 with the DC voltage gain of the operational amplifier U1 set to 200. A third plot 38c shows the gain of the RF power amplifier circuit 10 with the DC voltage gain of the operational amplifier U1 set to 1000. A fourth plot 38d shows the gain of the RF power amplifier circuit 10 when the source terminal 18s is connected directly to ground, whereas a fifth plot 38e shows the gain of the RF power amplifier circuit 10 when the source terminal 18s is connected to ground over the inductor L3 corresponding to the source degeneration inductance. Thus, it is understood that the RF power amplifier circuit 10 operates similarly over a wide range of DC voltage gain of the operational amplifier U1.

Figure 5C:
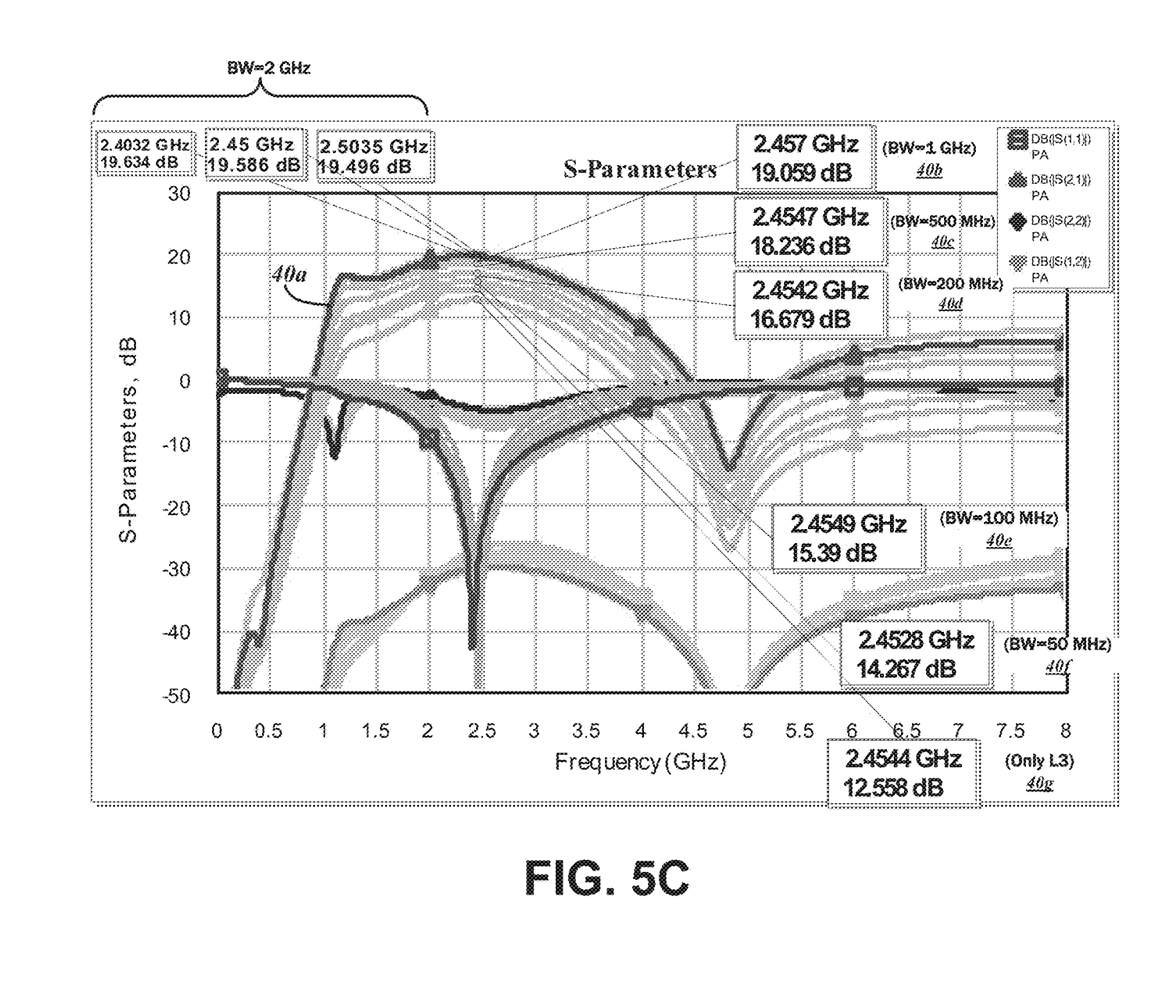
FIG. 5C is a graph plotting the S-parameters of the RF power amplifier of the present disclosure over the operational amplifier 3 dB bandwidth.

The graph of FIG. 5C plots the various simulated small-signal S-parameters versus frequency of the RF power amplifier circuit 10 shown in FIG. 4, with additional plots corresponding to different operational amplifier 3 dB bandwidth configurations. A first plot 40a shows the gain of the RF power amplifier circuit 10 including the negative capacitance circuit 12 when the 3 dB bandwidth is 2 GHz. Furthermore, a second plot 40b shows the gain corresponding to a 3 dB bandwidth of 1 GHz, a third plot 40c shows the gain corresponding to a 3 dB bandwidth of 500 MHz, a fourth plot 40d showing the gain corresponding to a 3 dB bandwidth of 200 MHz, a fifth plot 40e showing the gain corresponding to a 3 dB bandwidth of 100 MHz, and a sixth plot 40f showing the gain corresponding to a 3 dB bandwidth of 50 MHz. A seventh plot 40g shows the gain in the absence of the negative capacitance circuit 12, with only the source degeneration inductance L3. As shown, it is possible for the negative capacitance circuit 12 to have a 3 dB bandwidth below the power amplifier operating frequency while still achieving increased gain.

Figure 6:
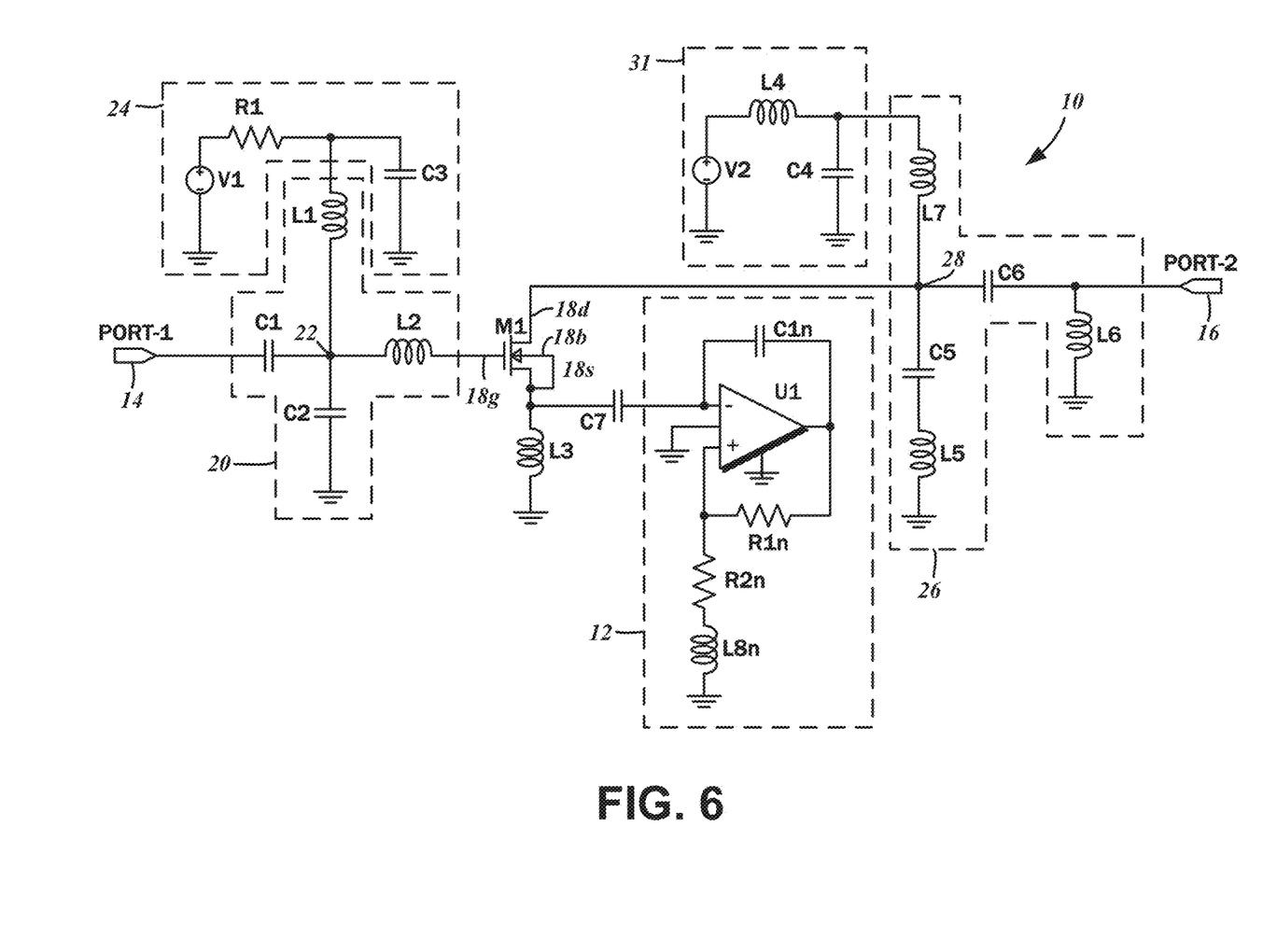
FIG. 6 is a schematic diagram of the RF power amplifier circuit incorporating a variation of the operational amplifier-based negative capacitance circuit.

Referring now to the schematic diagram of FIG. 6, an alternative configuration of the negative capacitance circuit 12 is shown, in the context of the RF power amplifier circuit 10. Specifically, there is an additional negative capacitance circuit inductance L8n connected to the negative capacitance circuit second resistor R2n. It is contemplated that the inductance L8n represents an extended trace on the semiconductor die, as would be utilized when the RF power amplifier circuit 10 is disposed within an interior region of the die away from its edges. Thus, the floor planning of the die can be simplified.

Figure 7:
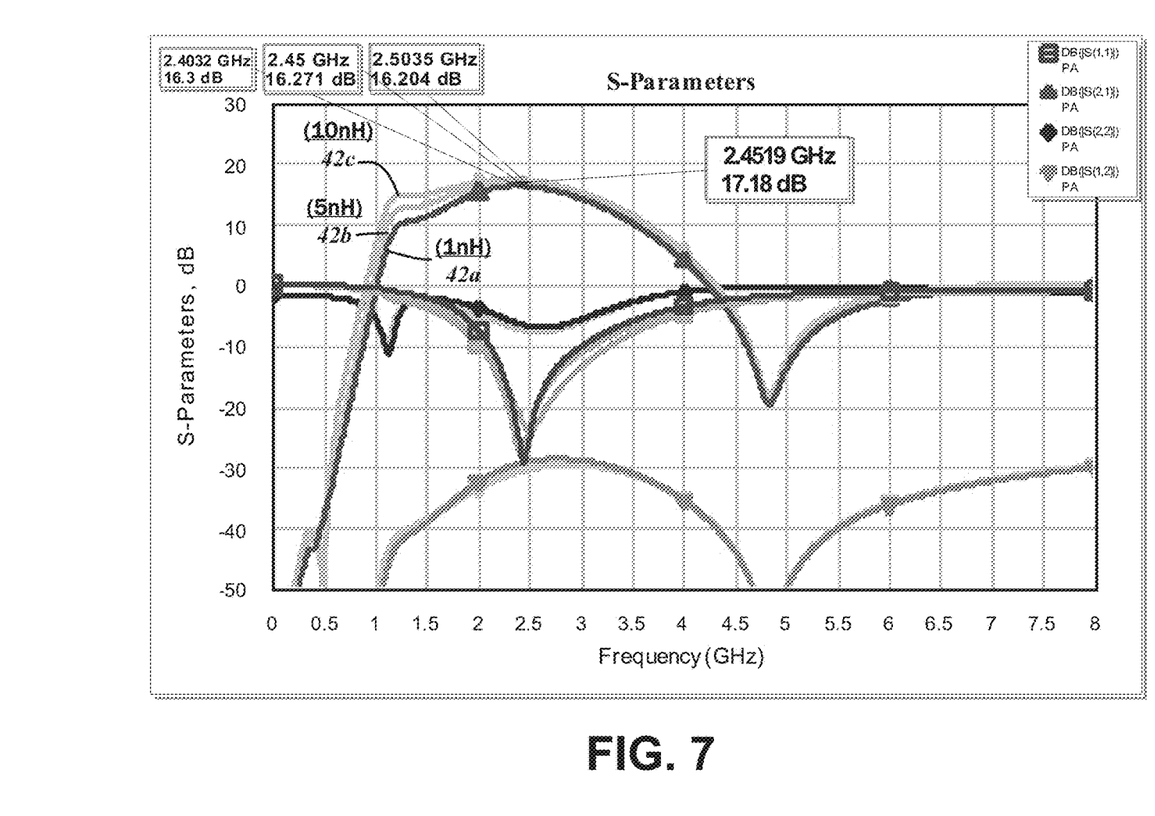
FIG. 7 is a graph plotting the S-parameters of the RF power amplifier with the negative capacitance circuit as depicted in FIG. 6.

The graph of FIG. 7 plots the simulated small-signal S-parameters versus frequency of the RF power amplifier circuit 10 shown in FIG. 6 including the additional negative capacitance circuit inductance L8n. A first plot 42a is of the gain with the inductance L8n at 1 nH, while a second plot 42b is of the gain with the inductance L8n at 5 nH. Furthermore, a third plot 42c is of the gain with the inductance L8n at 10 nH. As shown, this inductance is understood to have a negligible effect on in-band gain. The parameters for the RF power amplifier circuit 10, and specifically the negative capacitance circuit 12 for the simulation include an operational amplifier DC gain of 200, and an operational amplifier 3 dB bandwidth of 1 GHz.

The negative capacitance circuit 12 as set forth herein may be utilized for other RF circuitry other than power amplifiers where a sensitive connection to package ground is needed, and may be substituted for conventional through silicon vias. This is understood to reduce costs significantly.

The particulars shown herein are by way of example and for purposes of illustrative discussion of the embodiments of the power amplifier circuits and the negative capacitance circuits only and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A radio frequency power amplifier circuit for a predefined operating frequency band, the radio frequency power amplifier circuit including an input and an output, comprising:
   a power amplifier transistor with a first terminal connected to the input, a second terminal connected to the output, and a third terminal defined by an inductance;
   a first capacitor connected to the third terminal of the power amplifier transistor; and
   a negative capacitance circuit connected to the third terminal in series with the first capacitor, the negative capacitance circuit and the first capacitor defining a series resonance at the predefined operating frequency band, and the inductance of the third terminal being shunted by the negative capacitance circuit and the first capacitor.

2. The radio frequency power amplifier circuit of claim 1 wherein the negative capacitance circuit and the first capacitor have an equivalent impedance lower than 0.5 Ohm.

3. The radio frequency power amplifier circuit of claim 1 wherein the negative capacitance circuit is connected to ground.

4. The radio frequency power amplifier circuit of claim 1 wherein the negative capacitance circuit includes an operational amplifier with a positive input, a negative input, and an output, a first negative capacitance circuit capacitor connected to the negative input and the output of the operational amplifier, a first negative capacitance circuit resistor connected to the positive input and the output of the operational amplifier, and a second negative capacitance circuit resistor connected to the positive input of the operational amplifier.

5. The radio frequency power amplifier circuit of claim 4 wherein the second negative capacitance circuit resistor is connected to ground.

6. The radio frequency power amplifier circuit of claim 4 wherein the negative capacitance circuit includes a negative capacitance circuit inductor connected to the second negative capacitance circuit resistor.

7. The radio frequency power amplifier circuit of claim 6 wherein the negative capacitance circuit inductor is a trace on a semiconductor die.

8. The radio frequency power amplifier circuit of claim 1 wherein the power amplifier transistor, the first capacitor, and the negative capacitance circuit are disposed within an interior region of a semiconductor die.

9. The radio frequency power amplifier circuit of claim 1 wherein the power amplifier transistor is an n-type metal oxide semiconductor transistor, the first terminal being a gate, the second terminal being a drain, and a third terminal being a source, the third terminal being connected to a body of the power amplifier transistor.

10. The radio frequency power amplifier circuit of claim 1 wherein the power amplifier transistor is a bipolar junction transistor, the first terminal being a base, the second terminal being a collector, and the third terminal being an emitter.

11. The radio frequency power amplifier circuit of claim 1 further comprising an input matching circuit connected to the input and the first terminal of the power amplifier transistor, and an output matching circuit connected to the output and the second terminal of the power amplifier transistor.

12. The radio frequency power amplifier circuit of claim 1 further comprising a control voltage source connected to the first terminal of the power amplifier transistor and defining a bias point thereof.

13. The radio frequency power amplifier circuit of claim 1 further comprising a bias voltage source connected to the second terminal of the power amplifier transistor.

14. A radio frequency front end circuit for a predefined operating frequency band, the radio frequency front end circuit including a circuit input and a circuit output, comprising:
   a power amplifier with a first terminal connected to the circuit input, a second terminal connected to the circuit output, and a third terminal defined by a degeneration inductance;
   a first capacitor connected to the third terminal of the power amplifier transistor; and a negative capacitance circuit connected to the third terminal in series with the first capacitor, the negative capacitance circuit including an operational amplifier with a non-inverting input, an inverting input to which the first capacitor is connected, and an output, the negative capacitance circuit together with the first capacitor defining a series resonance at the predefined operating frequency band, and the inductance of the third terminal being shunted by the negative capacitance circuit and the first capacitor.

15. The radio frequency front end circuit of claim 14 wherein the negative capacitance circuit includes a first resistor connected to the non-inverting input and the output of the operational amplifier, and a second resistor connected to the non-inverting input of the operational amplifier.

16. The radio frequency front end circuit of claim 15 wherein the negative capacitance circuit includes an inductor connected to the second resistor.

17. The radio frequency front end circuit of claim 14, further comprising an input matching circuit connected to the circuit input and the power amplifier, and an output matching circuit connected to the power amplifier and the circuit output.

18. A radio frequency circuit for a predefined operating frequency band and connectable to a semiconductor package ground via a ground circuit path defining an inductance, the radio frequency circuit comprising:
a first capacitor connected to the ground circuit path;
a negative capacitance circuit connected to the ground circuit path in series with the first capacitor, the negative capacitance circuit including an operational amplifier with a non-inverting input, an inverting input to which the first capacitor is connected, and an output, the negative capacitance circuit together with the first capacitor defining a series resonance at the predefined operating frequency band, and the inductance of the ground circuit path being shunted by the negative capacitance circuit and the first capacitor.

19. The radio frequency circuit of claim 18 wherein the negative capacitance circuit includes a first resistor connected to the non-inverting input and the output of the operational amplifier, and a second resistor connected to the non-inverting input of the operational amplifier.

20. The radio frequency circuit of claim 19 wherein the negative capacitance circuit includes an inductor connected to the second resistor.

* * * * *